(12) United States Patent
Li et al.

(10) Patent No.: US 10,963,302 B2
(45) Date of Patent: Mar. 30, 2021

(54) SPATIALLY PROGRAMMED LOGIC ARRAY ARCHITECTURE

(71) Applicant: Wisconsin Alumni Research Foundation, Madison, WI (US)

(72) Inventors: Jing Li, Madison, WI (US); Yue Zha, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 60 days.

(21) Appl. No.: 16/362,122

(22) Filed: Mar. 22, 2019

(65) Prior Publication Data
US 2020/0301722 A1 Sep. 24, 2020

(51) Int. Cl.
*G06F 9/50* (2006.01)
*G06F 9/48* (2006.01)
(Continued)

(52) U.S. Cl.
CPC ............... *G06F 9/50* (2013.01); *G06F 9/455* (2013.01); *G06F 9/45533* (2013.01); *G06F 9/45558* (2013.01); *G06F 9/48* (2013.01); *G06F 9/485* (2013.01); *G06F 9/4806* (2013.01); *G06F 9/4843* (2013.01); *G06F 9/4856* (2013.01); *G06F 9/4881* (2013.01); *G06F 9/5005* (2013.01); *G06F 9/5011* (2013.01); *G06F 9/5022* (2013.01); *G06F 9/5027* (2013.01); *G06F 9/5044* (2013.01); *G06F 9/5077* (2013.01); *G06F 9/5083* (2013.01); *G06F 9/5088* (2013.01); *G06F 9/544* (2013.01); *G06F 12/10* (2013.01); *G06F 30/34* (2020.01); *G06F 2009/4557* (2013.01);
(Continued)

(58) Field of Classification Search
CPC ... G06F 9/455; G06F 9/48; G06F 9/50; G06F 9/45533; G06F 9/4558; G06F 2009/4557; G06F 2009/45575; G06F 2009/45583; G06F 9/4806; G06F 9/4843; G06F 9/485; G06F 9/4856; G06F 9/4881; G06F 9/5005; G06F 9/5011; G06F 9/5022; G06F 9/5027; G06F 9/5044; G06F 9/5061; G06F 9/5077; G06F 9/5083; G06F 9/5088
See application file for complete search history.

(56) References Cited

U.S. PATENT DOCUMENTS

| 2013/0243329 | A1* | 9/2013 | Oro Garcia | .......... G06K 9/6257 |
| | | | | 382/195 |
| 2017/0195173 | A1* | 7/2017 | Izenberg | .............. G06F 9/45558 |
| 2017/0308504 | A1* | 10/2017 | Cook | .................... G06F 9/5083 |

OTHER PUBLICATIONS

Weerasinghe et al, "Enabling FPGAs in Hyperscale Data Centers", IEEE, 2015, pp. 1078-1086 (Year: 2015).*
(Continued)

*Primary Examiner* — Charles M Swift
(74) *Attorney, Agent, or Firm* — Boyle Fredrickson, S.C.

(57) ABSTRACT

A spatially programmed logic circuit (SPLC) array system performs spatial compilation of programs for use in the SPLCs to produce standardized compiled blocks representing predetermined portions of an SPLC. The blocks may be freely relocated in an SPLC after compilation by editing of the compiled file. Inter-block communication circuitry allows joining of blocks within an SPLC or across SPLCs to allow scalability and accommodation of different programs with efficient utilization of an SPLC for multiple programs, again without recompilation.

19 Claims, 6 Drawing Sheets

(51) Int. Cl.
   *G06F 9/455* (2018.01)
   *G06F 9/54* (2006.01)
   *G06F 12/10* (2016.01)
   *G06F 30/34* (2020.01)
(52) U.S. Cl.
   CPC .............. *G06F 2009/45575* (2013.01); *G06F 2009/45583* (2013.01); *G06F 2009/45595* (2013.01)

(56) References Cited

OTHER PUBLICATIONS

Chen et al, "Enabling FPGAs in the Cloud", 2014, ACM 978-1-4503-2870-8/14/05, pp. 1-10 (Year: 2014).*

Tarafdar et al, "Designing for FPGAs in the Cloud", Sep. 2017, IEEE, pp. 23-29 (Year: 2017).*

Jagath Weerasinghe, Francois Abel, Christoph Hagleitner, Andreas Herkersdorf; Enabling FPGAs in Hyperscale Data Centers; Conference date Aug. 2015; https://www.researchgate.net/publication/280942625—(10) pages.

Oliver Knodel and Rainer G. Spallek; "RC3E; Provision and Management of Reconfigurabie Hardware Accelerators in a Cloud Environment"; Parallel Processing (ICPP), 42nd Int'l Conf. on, IEEE, 2013—(6) pages.

Fei Chen, Yi Shan, Yu Zhang, Yu Wang, Hubertus Franke, Xiaotao Chang, Kun Wang; "Enabling FPGAs in the Cloud"—(10) pages.

Ahmed Khawaja, Joshua Landgraf, Rohith Prakash, Michael Wei, Eric Schkufza and Christopher J. Rossbach; "Sharing, Protection, and Compatibility for Reconfiourable Fabric with AmorphOS"; 13th USENIX Symposium on Operating Systems Design and Implementation (OSDI '18); Oct. 8-10, 2018; Carlsbad, CA, USA—(23) pages.

* cited by examiner

SPATIALLY PROGRAMMED LOGIC ARRAY ARCHITECTURE

STATEMENT REGARDING FEDERALLY SPONSORED RESEARCH OR DEVELOPMENT

This invention was made with government support under D16AP00122 awarded by the DOD/DARPA. The government has certain rights in the invention.

CROSS REFERENCE TO RELATED APPLICATION

BACKGROUND OF THE INVENTION

The present invention relates to "cloud" computer architectures in which programs can be flexibly allocated to different network-connected processors on a dynamic basis, and in particular to a cloud computer architecture allowing programs intended for spatially-programmed logic circuits (SPLC's) such as field programmable gate arrays (SPLCs) to be dynamically reallocated among SPLC hardware.

Cloud computing provides a set of network-connected computing resources. Users provide programs which are dynamically allocated in real time to available computing resources on a demand basis. As program demand increases, additional computing resources are allocated to the program to allow flexible scaling.

An important technology underlying cloud computing is virtualization in which the computing resources are presented as virtual machines. Virtualization allows programs to be allocated to "virtual machines" which hide the actual hardware of the computer resources, for example, by memory address remapping and timesharing of processors and other peripherals. Virtualization facilitates the sharing of computer resources required by cloud computing by allowing compilation to standardized virtual machines and also a finer granularity of sharing to the extent that a single processor system can host multiple virtual machines.

Virtualization is relatively simple with standard computer programs which can be compiled to the virtual machine and then easily allocated to actual physical hardware by adjusting address translation tables. Compiling of a standard computer program may be termed "address" compiling to the extent that it maps the object code program to a particular address space of a virtual machine.

Some programs using cloud computing can be greatly accelerated if executed on field programmable gate arrays (FPGAs) instead of general-purpose processors (CPUs), Currently FPGAs are employed in cloud computing either by providing preprogrammed FPGAs capable of particular accelerator tasks (for example, neural net processing) or by providing blank .FPGAs that can be programmed by the customer.

Unlike the "address " compiling of standard computer programs, programs for FPGAs provide "spatial" compiling which maps the program to particular hardware arranged spatially on the FPGA chip. The spatial linkage occurs, in part, because the FPGA implements dataflow calculations where programs are implemented by spatially defined paths in circuit hardware, and also because the resources of the FPGA are not uniformly distributed on the chip and thus certain functions have to be implemented at certain locations on the chip.

This spatial compiling is complex and for reasonably sized programs can take hours to complete. For this reason, to the extent that moving an FPGA program flexibly among different FPGA resources or different locations on different FPGAs requires recompilation of the program, such a process would be impractically time-consuming and unworkable in a real-time, dynamic environment.

SUMMARY OF THE INVENTION

The present invention permits flexible relocation of programs on FPGA hardware and similar spatially-programmed logic circuits (SPLCs) at speeds conducive to virtualization by pre-compiling the SPLC program to predefined virtual blocks of SPLC resources. Each block can then be mapped flexibly to predefined SPLC hardware blocks at different locations in the SPLC through a simple offsetting process that does not require recompilation. The blocks include programming for intercommunication among blocks on the same or different SPLCs, varying the number of blocks to be linked to a given program without recompilation permitting a high degree of scalability as well as high granularity in the allocation process.

Specifically, the present invention provides SPLC array architecture system having a set of general-purpose computer processing units, a set of SPLCs, and a memory system. The SPLCs each provide resources divisible into multiple identical physical blocks. The memory system includes a resource file and an allocation file where the resource file holds spatially compiled different application programs compiled to an indicated number of identical virtual blocks of SPLC resources mappable to the identical physical blocks of the set of SPLCs, and the allocation file holds a list of available blocks in the field programmable gate arrays. An interconnection network communicates between the computer processing units and between field programmable gate arrays, and at least one computer processing unit executes a virtualizer communicating with the resource file to:

(a) receive a request to instantiate an SPLC application program identifying a number of blocks;
(b) identify the spatially compiled application program in the resource file;
(c) identify at least one SPLC having space for holding the identified number of virtual blocks of the identified spatially compiled application program;
(d) relocate the spatially compiled application program to be received by identified physical blocks; and
(e) program the identified at least one field programmable gate array to receive the relocated indicated number of virtual blocks of the identified spatially compiled application program.

It is thus a feature of at least one embodiment of the invention to permit pre-compiling of SPLC programs to standard virtual blocks that can be simply offset to be allocated and repositioned in different SPLCs without recompiling. By compiling to standard block sizes having corresponding virtual and physical realizations, the SPLC programs as compiled may be simply moved by modification of coordinate values in the files without recompilation allowing resources to be scaled or shared appropriately.

Step (d) may relocate different parts of the spatially complied application program to at least two SPLCs.

It is thus a feature of at least one embodiment of the invention to allow a precompiled program to be allocated in a way that spans different SPLCs greatly increasing efficient use of SPLC resources, for example, using portions of an SPLC left over after loading of another program.

The resource file holding the spatially compiled application programs may further hold a spatially compiled address translation program, and step (f) may load the spatially compiled address translation program into the at least one identified programmable field gate array arid may provide offset addresses to the address translation program based on the identified field programmable gate array and the relocation of the spatially compiled application program. The address translation program provides virtualization in the communication between the field programmable gate arrays and computer memory.

It is thus a feature of at least one embodiment of the invention to facilitate relocation of SPLC programs by providing address—space virtualization similar to that done with standard computer hardware. The address translation values are variables (register values) that can be set based on the known positioning of the SPLC program blocks without recompilation.

The resource file holding the spatially compiled application program may further hold a spatially compiled inter-SPLC communication program for communicating between SPLCs. In this regard, the computer processor executing the virtualizer may divide an application program among at least two different SPLCs and provides inter-SPLC programs on the two different SPLCs with connection variables to connect the two SPLCs for data flow between portions of the application program.

It is thus a feature of at least one embodiment of the invention to allow a program to be broken between SPLCs after compilation by providing dedicated circuitry for inter-SPLC communication affected by loading variable or register values.

In one embodiment, the computer processor executing the virtualizer may divide the application program between two different SPLCs only between spatial rows of physical blocks of the SPLCs.

It is thus a feature of at least one embodiment of the invention to greatly simplify inter-block communication by limiting the splitting of programs to rows that may provide for simple parallel interconnection between row elements.

The resource file holding the spatially compiled application program may further hold a spatially compiled intra-SPLC communication program for communicating between blocks within a single SPLC.

It is thus a feature of at least one embodiment of the invention to handle all communication between blocks with dedicated communication circuity to allow splitting of the program among different SPLCs or the use of a single SPLC without the need for recompilation but instead by switching the type of communication that occurs between blocks.

The computer processor executing the virtualizer may further load the intra-SPLC communication programs with connection variables to connect different blocks in an SPLC for data flow between the different blocks.

It is thus a feature of at least one embodiment of the invention to permit changes in connections between blocks (necessary for post-compilation dividing the blocks among different SPLCs that are the same SPLC) to be implemented with variable setting rather than recompilation.

The inter-SPLC communication program and intra-SPLC communication program have local gating to synchronize the received data.

It is thus a feature of at least one embodiment of the invention to allow the SPLC program to be split among multiple SPLCs in a manner invisible to the operation of the program without upsetting timing assumptions.

The computer processing unit may perform the relocating of step (d) by applying an offset to portions of the spatially compiled application program data.

It is thus a feature of at least one embodiment of the invention to provide a relocation method that can work directly on the compiled file without recompilation.

The SPLC array architecture may further include at least one computer processor executing an SPLC compiler wherein the compiler has a target architecture comprised of virtual blocks and wherein the number of virtual blocks is larger than the number physical blocks in each SPLC.

It is thus a feature of at least one embodiment of the invention to implement the relocatable compiled programs using a standard compiler targeting a virtual block-based architecture providing similar virtual and physical blocks but differing from the actual target architecture having a larger number of virtual blocks than physical blocks to provide great versatility to the user in constructing SPLC programs.

The compiler may minimize at least one of number of physical blocks, number of paths between physical blocks, and path length between physical in the spatially compiled program.

It is thus a feature of at least one embodiment of the invention to promote a compilation process that promotes efficient use of the SPLC to improve utilization of the SPLC by offering more opportunity for the execution of multiple programs in a given SPLC.

In one embodiment, the invention may provide a spatially programmed logic circuit (SPLC) architecture having an integrated circuit providing a set of identical physical blocks. Each physical block may hold (a) field programmable processing resources that can be programmably connected to change data flow through the processing resources to implement at least a portion of an application program; and (b) non-programmable interface circuitry providing communication between the physical blocks and other physical blocks and communication between the physical blocks and external memory. The integrated circuit further holds programming circuitry for receiving a compiled application program in selectively programming the programmable resources of the physical blocks according to that application program.

It is thus a feature of at least one embodiment of the invention to provide a special FPGA-type integrated circuit that provides uniform physical blocks to better operate with the present invention system of flexibly allocating application programs among SPLC's.

These particular objects and advantages may apply to only some embodiments falling within the claims and thus do not define the scope of the invention.

DETAILED DESCRIPTION OF THE PREFERRED EMBODIMENT

Figure 1:
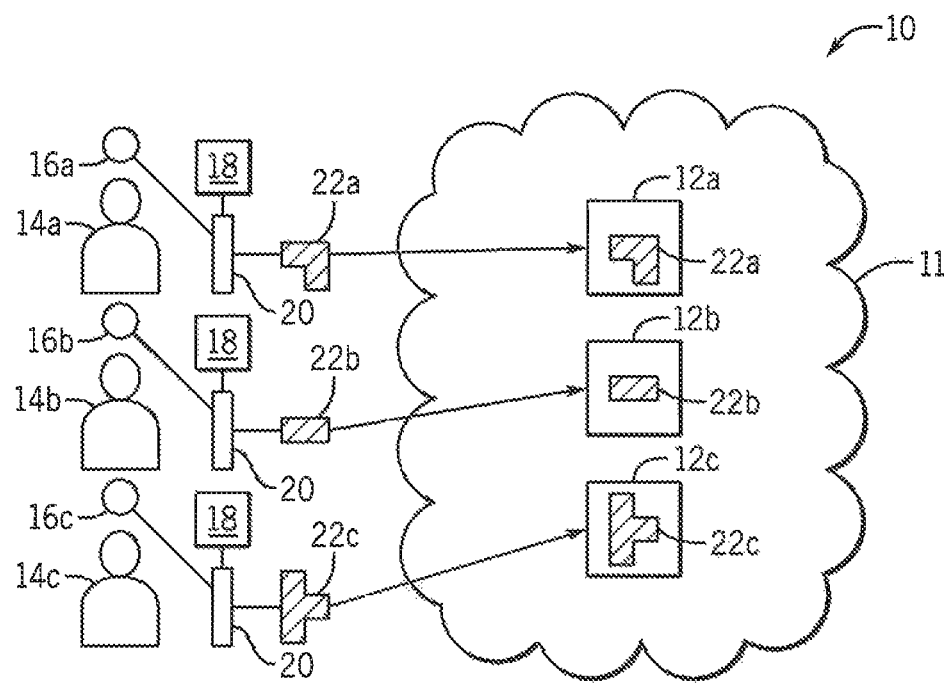
FIG. 1 is a simplified representation of prior art implementation of FPGAs in a cloud environment showing spatial compilation of application programs which makes it difficult to virtualize FPGAs for cloud use.

Referring now to FIG. 1, a prior art cloud architecture 10 may provide for multiple spatially program logic circuits (SPLCs) 12a-12c interconnected by a cloud network 11 generally including a network and at least one processor 52 (for example a standard CPU) running a cloud system for assigning the SPLCs 12a-12c to particular users 14a-14c.

The SPLC's 12, for example, may be standard field programmable gate arrays (FPGAs), complex programmable logic devices (CPLDs), coarse-grained reconfigurable arrays (CGRAs) and the like. The SPLC's 12 require spatial compiling where application programs are converted into changes in the path of data through specific circuits in the devices at relative specific spatial locations. Spatial compilation produces object code that is tightly linked to particular locations in the SPLC hardware and the type of SPLC requiring recompilation if that location or hardware changes. This programming is analogous to the rewiring of an integrated circuit but can be performed with programmable connections. Such recompilation can take many hours and thus is generally impractical within the timescales required of reconfiguring cloud-based networks.

The processor 52, in contrast, may be a standard von Neumann type processor executing memory stored instructions that can be readily relocated to different hardware by a simple linking or loading operation.

In a typical prior art system, the users 14a-14c may compile programs 16 for a target FPGA architecture 18 matching the FPGAs 12 assigned to them using a spatial compiler 20 producing spatially linked object code 22. The spatially linked object code 22 has a spatial configuration (represented as a shape in FIG. 1) describing Where the different program portions of the object code 22 reside on the FPGA integrated circuit.

The different shapes of the spatially compiled object code 22 for each user users 14a-14c and the difficulty of recompiling the programs 16 to reside in different locations on the FPGAs 12 (for example, to put one program into the space remaining after the loading of another program) prevent ready sharing of an FPGA 12 among different programs 16. It will be understood that two different programs 16 may be jointly compiled to fit on a particular FPGA but that this process may take many hours and thus is not practical for rapidly shifting FPGA resources among different programs 16 in a cloud environment.

Figure 2:
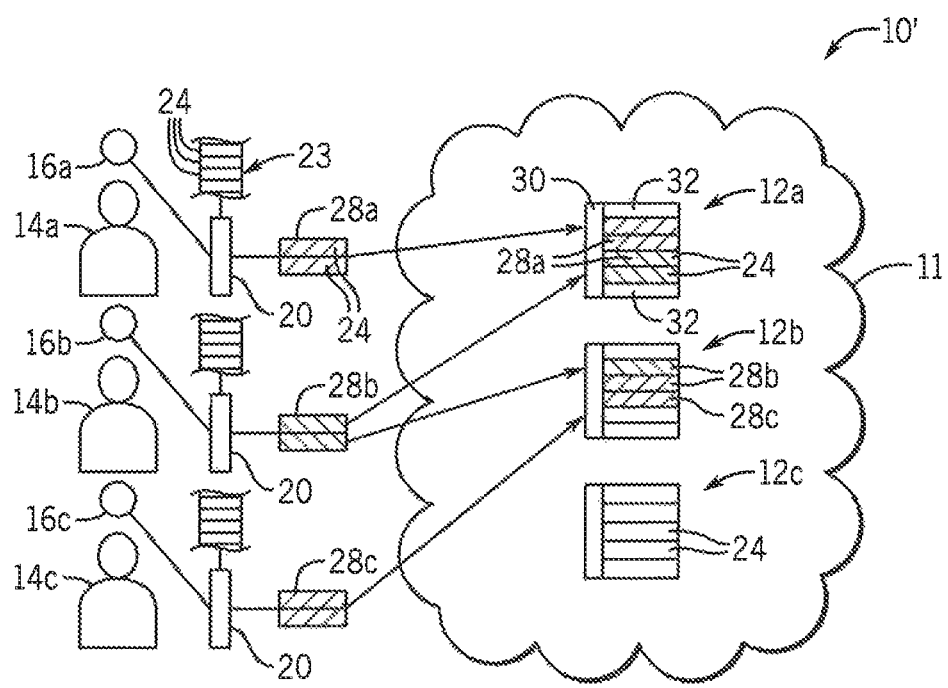
FIG. 2 is a figure similar to FIG. 1 showing the present invention's spatial compilation of application programs to relocatable blocks having dedicated communication circuits to allow combinations within and across FPGAs.

Referring now to FIG. 2, in the present invention, the users 14 compile their respective program 16 with respect to target virtual SPLC 18 providing a set of virtual blocks 24 having uniform hardware capabilities and representing a subset of actual physical blocks 24' of SPLCs 12. The target virtual SPLC architecture 23 may differ from the SPLCs 12 in terms of the having a much larger number of virtual blocks 24 than physical blocks 24'; however, the function of the virtual blocks 24 can be fully realized by the corresponding physical blocks 24' of the SPLCs 12.

The resulting compilation produces spatial object code 28 in the form of one or more virtual blocks 24. These compiled virtual blocks 24 may be dynamically and flexibly mapped to different physical blocks 24' using a simple offsetting process operating on the compiled code without the need for recompilation. This allows a coarse-grained spatial remapping of compiled SPLC spatial object code 28 dynamically on a real-time basis among physical blocks 24'.

Simple relocation of the compiled virtual blocks 24 into different physical blocks 24' requires that the SPLCs 12 also implement address and peripheral translation for the physical blocks 24'. This is done through translation circuitry 30 that will be added to each physical block 24'. In addition, communication circuitry 32 is provided for each physical block 24' allowing communication with other physical blocks 24' on the same SPLC 12 or on different SPLCs 12. This translation and communication will change depending on the location of the physical block 24', but these changes may be implemented by simply loading register values with data after compilation and do not require recompilation of the programs 16. As new programs 16 are introduced into the cloud architecture 10', they are precompiled to virtual blocks 24 that may be dynamically fit into open physical blocks 24' of available SPLCs 12 (without recompilation) either within a single SPLC 12 or in physical blocks 24' spanning multiple SPLCs 12 to allow ready scalability and relocation.

Figure 3:
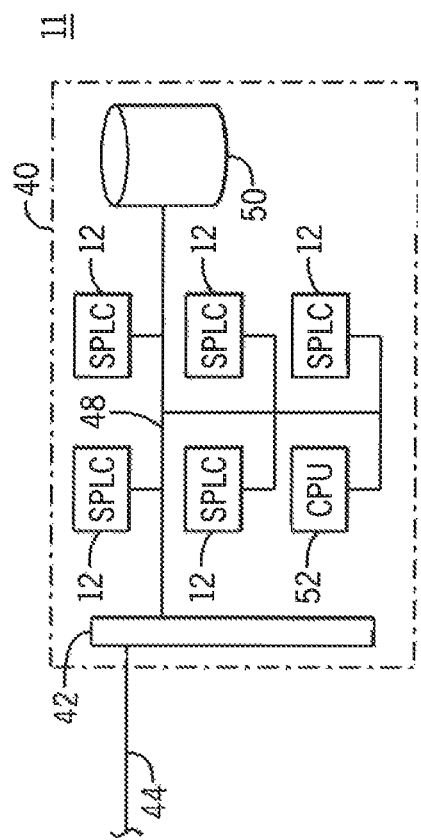
FIG. 3 is a block diagram of an SPLC card suitable for use in cloud computing environments per the present invention.

Referring now to FIG. 3, in one embodiment, the SPLCs 12 may be implemented on a set of modular SPLC cards 40 having network interface circuit 42 for communicating on a cloud network 44 joining the SPLC cards 40 with other computing resources of the network. The SPLC card 40 efficiently collects multiple SPLCs 12 (for example, twenty or more) joined by a high-speed internal bus 48 communicating data and instructions that are being loaded into the SPLCs 12 and joining SPLCs 12 with the network interface circuit 42 and with a shared local memory system 50, for example, of high-speed RAM or the like. The network interface circuit 42 allows each SPLC to receive programming instructions and data from elsewhere in the cloud and to allow loading and reading of the local memory 50 and synchronizing the local memory 50 with a cloud system memory (not shown) and the like. The modular SPLC card 40 may optionally include one CPU 52 providing an SPLC cloud server 60 as will be discussed below. In the simplest case, the SPLCs 12 may be identical, however, the invention contemplates that different types of SPLCs 12 may be used.

Figure 4:
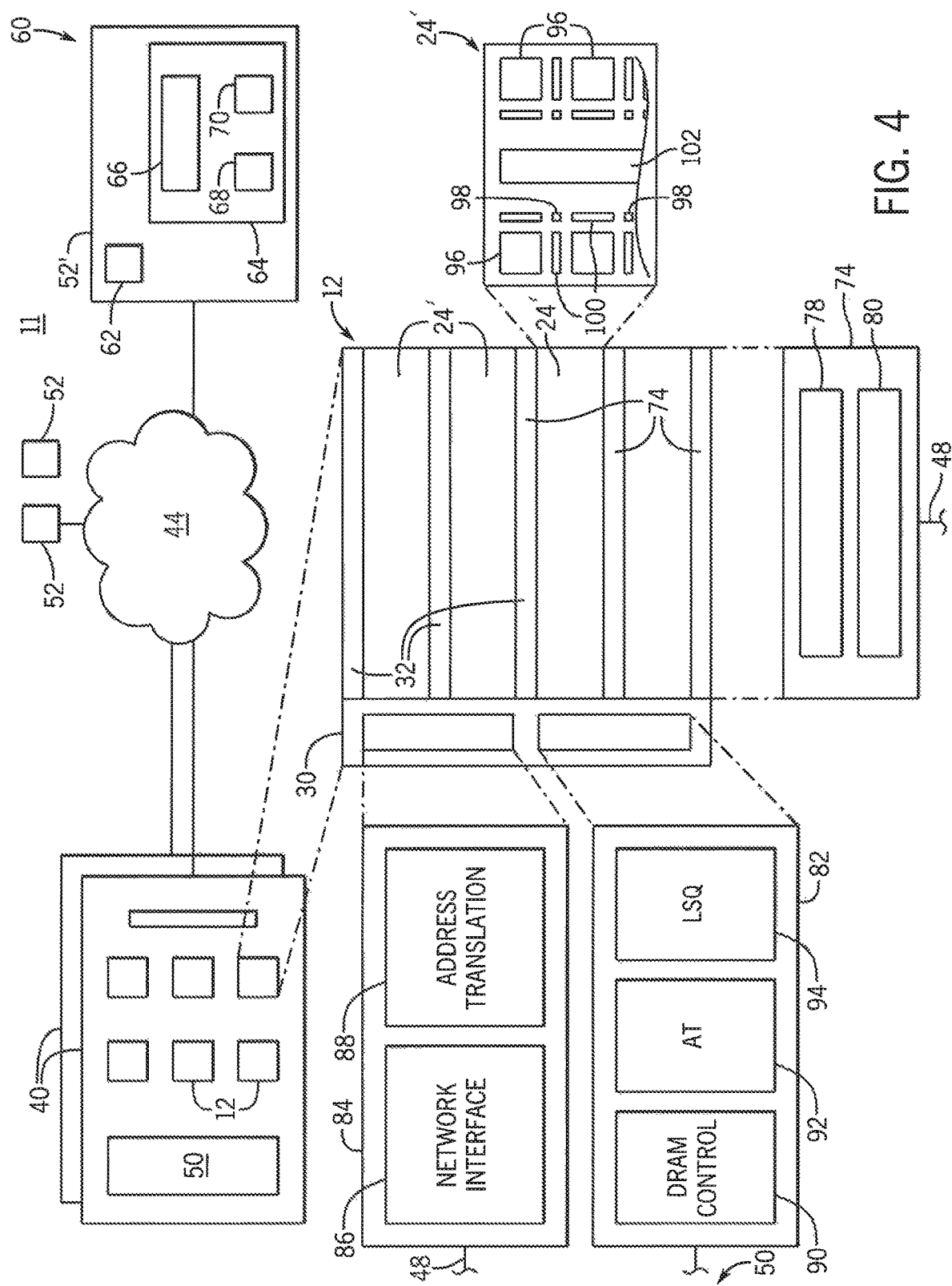
FIG. 4 is a detailed block diagram of the SPLC card of FIG. 3 integrated into a cloud with a hypervisor CPU and showing an expanded views of various components of the SPLCs and the virtual blocks.

Referring now to FIG. 4, one or more of these modular cards 40 may communicate over the cloud network 44 in the cloud architecture 10' with other computing resources such as standard CPUs 52. At least one CPU 52. providing an SPLC cloud server 60 operates to coordinate use of the SPLCs 12 in the cloud architecture 10'.

Generally the SPLC cloud server 60 may include one or more processors 62 communicating with a computer memory 64 holding an SPLC virtualizer program 66 communicating with an allocation table 68 and a resource table 70. As will be discussed in more detail below, the virtualizer program 66 manages allocation of programs 16 in real time to different SPLCs 12 using precompiled virtual blocks 24 held in the resource table 70. These virtual blocks 24 are allocated to open SPLC physical blocks 24' according to the allocation table 68 which records current block usage.

Referring still to FIG. 4, each SPLC 12 is divided for programming (implicit in the SPLC virtualizer program 66) into three sections discussed briefly above. The first section is physical blocks 24'. Each physical block 24' may contain identical resources for ease of implementation, however the invention contemplates allowing physical blocks 24' to have different resources or preferably to provide a limited number of different types of physical blocks 24' consistent with current SPLC architecture. Importantly, however, there will be multiple physical blocks 24' in a given SPLC 12 that are identical in resources. In a simplest embodiment, the physical blocks 24' are in a one-dimensional array (e.g. rows) to simplify allocation of virtual blocks 24 to physical blocks 24' as will be discussed however the invention contemplates that the physical blocks 24' may be located over a two-dimensional array.

Each physical blocks 24' is associated with SPLC communication circuitry 74 (being part of communication circuitry 32) allowing communication between different physical blocks 24' of a given SPLC 12. This communication circuitry 74 may in a simplest form allow communication only between adjacent rows of physical blocks 24', however the invention contemplates that arbitrary communication between physical blocks 24' better either adjacent or nonadjacent or arranged in a row (as shown) or in a two-dimensional array may be provided.

Each physical block 24° is also associated with inter-SPLC communication circuitry 74 (being part of communication circuitry 32) allowing communication via the high-speed internal bus 48 with other physical blocks 24' in different SPLCs 12. This inter-SPLC communication circuitry 74 may be identical to the intra-SPLC communication circuitry 74 and may include a buffer 78 and high-speed transceiver 80 providing asynchronous communication. Preferably, however, the inter-FPGA communication circuitry 74 may be limited to that required for only two physical blocks 24' in each FPGA to minimize overhead required for the circuitry.

The buffer 78 may provide local gating to ensure that all data being communicated between physical blocks 24' is locally synchronized to prevent race conditions for example by evaluating buffers associated with each data value and allowing the data to be read only when all buffers are full.

Each physical block 24' may also communicate with translation circuitry 30 which provides memory address translation circuitry 82 and network translation circuitry 84. The memory address translation circuitry 82 may work with the cloud architecture 10' to connect data in memory 50 intended for a given program 16 to the proper SPLCs 12 and physical blocks 24' for reading and writing therein regardless of where those physical blocks 24' are located. The memory address translation circuitry 82 provides virtualization of the memory 50 allowing the physical blocks 24' representing given virtual blocks 24 to be easily relocated. The memory address translation circuitry 82 provides a memory controller 90 for interfacing with the memory 50 and an address translation table 92 similar to those used in virtualization of standard computer programs, plus a load/store queue 94 for buffering load and store requests. The invention contemplates that there may be other types of translation circuitry for other physical resources that are connected to the FPGAs operating on a similar principle.

The network translation circuitry 84, similarly, handles the last level of address translation within the array of SPLCs 12 on the card 40 (shown in FIG. 3) and may include a local network interface 86 working with high-speed internal bus 48 and an address translation table 88 identifying the appropriate physical blocks 24" and SPLC 12. In this way the program 16 may communicate on the network 44 regardless of its location in an SPLC 12.

The memory address translation circuitry 82 and the network translation circuitry 84 may be easily reprogrammed after compilation (to conform with the location of the virtual blocks 24 in particular physical blocks 24') by simply loading the necessary data into the address translation table 92 and address translation table 88.

Referring still to FIG. 4, each of the physical blocks 24' may hold an identical set of SPLC hardware resources including configurable logic blocks 96, switch blocks 98, connection blocks 100, and hard IP blocks 102 such as local memory. These components are well known in the art of SPLC architectures and allow a program to be implemented by physical electrical interconnection of the configurable logic blocks (for example, which may represent gates or the like in dataflow networks) with each other. As noted, however, the physical blocks 24' may have predetermined different hardware resources associated with corresponding different virtual blocks 24 as part of a limited set of different types of virtual blocks 24 providing different capabilities.

In a simplest case, the physical blocks 24' are physically laid out as a set of rows to facilitate intercommunication between any number of other physical blocks 24' of a program implemented in adjacent rows, however, this is not required, and the physical blocks 24 may be laid out in a two dimensional array using the principles of this invention, It will be appreciated that although the intra-SPLC communication circuitry 74 are shown being local to each physical blocks 24' and the inter-SPLC communication circuitry 76 and translation circuitry 30 are shown as global for all sub blocks 72, the location of the circuitry is arbitrary and the invention contemplates either a distributed or centralized location of these particular functions as may best conserve SPLC resources while offering the desired flexibility.

Figure 5:
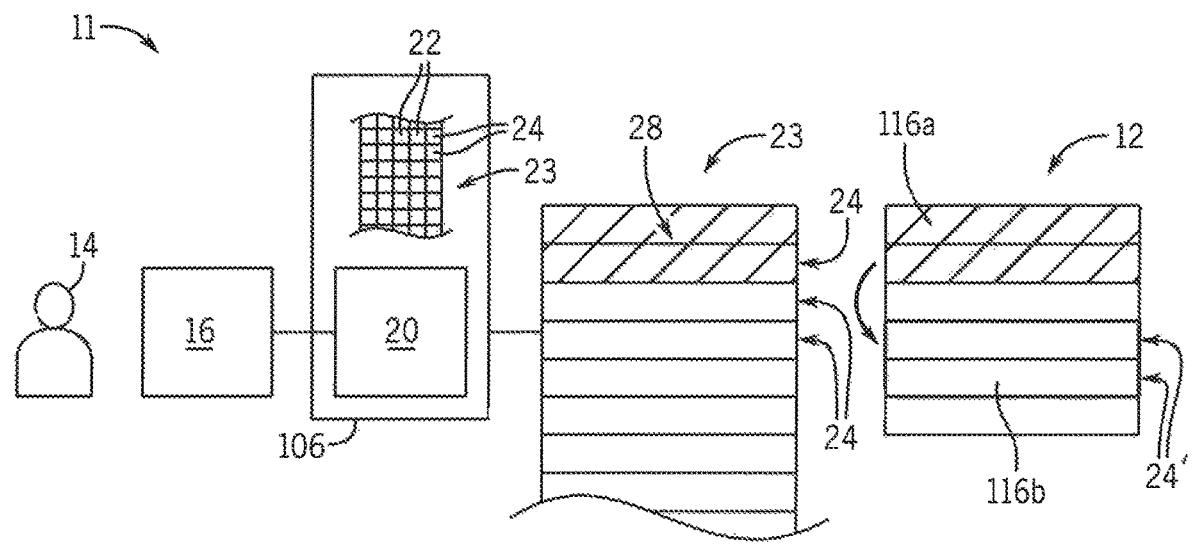
FIG. 5 is a process flow diagram of the compilation of an application program per the present invention into relocatable virtual blocks and virtual sub-blocks and showing relocation to physical blocks and sub-blocks in a physical SPLC.
Figure 8:
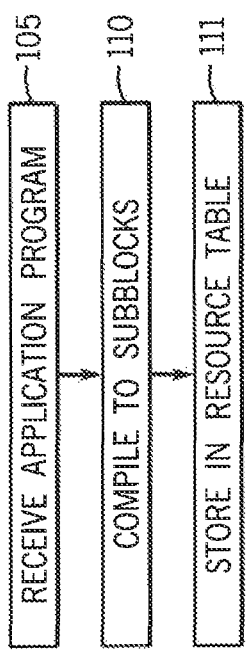
FIG. 8 is a flowchart showing the steps of compilation of FIG. 5.

Referring now to FIGS. 5 and 8, as generally discussed above, a user 14 of the cloud architecture 10' may receive application program 16, for example, as indicated by process block 105. The application program 16 may be prepared in a high-level programming language suitable for SPLCs 12 such as OpenCL.

This program 16 may be compiled, per process block 110, using a standard SPLC compiler 20 modified as will be described and running on a standard desktop computer 106 or on a CPU 52, for example, having a processor and associated memory for holding the compiler program. The compiler 20 is provided a target virtual SPLC 18 having virtual blocks 24 matching the capabilities of the physical blocks 24'. As noted, the physical blocks 24' may be laid out in rows in the SPLC 18 may have a limited number of physical blocks 24'. In contrast to the actual SPLC 12, however, the target virtual SPLC 18 will have an arbitrarily large or infinite number of rows or virtual blocks 24 to promote programs that may span an actual physical SPLC 12.

The compiler 20 will be modified so that the spatial object code 28 produced is associated with additional programs for the translation circuity 30 and for the communication circuitry 32 (including programming for inter-SPLC communication circuitry 76 and intra-SPLC communication circuitry 74) for each physical blocks 24' as described above. This modification may use additional physical blocks 24' for this purpose of compiling the additional programs, or preferably this compilation may designate pre-allocated portions of the SPLCs 12 outside of the virtual blocks 24.

As indicated by process block 110, a result of the compilation of the application program 16 is a set of virtual blocks 24 forming spatial object code 28 (shown in FIG. 5 by shaded blocks). This compilation process may be tailored to cluster the virtual blocks 24 of the spatial object code 28 together, for example, by minimizing the physical length of dataflow paths and, for example, to minimize the number of virtual blocks 24 used subject to any performance demands, Alternatively or in addition, the compiling may attempt to organize the virtual blocks 24 into a minimum number of virtual blocks 24 or may reduce the number interconnection between virtual blocks 24. The compiler may organize the virtual blocks 24 in a specific order to minimize interconnection lengths. Generally, as depicted in FIG. 5, the compiled SPLC spatial object code 28 will occupy a given number of rows (virtual blocks 24) and this allocation may be stored in the resource table 70 (shown in FIG. 1) for use as will be discussed per process block 111. This storage indicates both the interconnection of the elements of the SPLCs 12 and a location of those elements with respect to the target virtual SPLC 18.

Importantly, the virtual blocks 24 of the target virtual SPLC architecture 23 may be mapped to any arbitrary physical block 24' of an actual SPLC 12 without recompiling by a simple offsetting of particular values in the bitstream representing the spatial object code 28 that identifies coordinate locations of the components used in the SPLC 12. Unlike compilation which requires a highly interactive adjustment of interconnections between SPLC components, this offsetting process can be done at high speed. Programs suitable for performing this offsetting process include manual place and route tools available in most SPLC compilers, including the Vivado Design Suite commercially available from Xilinx, Inc., which allow post compiling relocation of programs. Thus, for example, spatial object code 28 of FIG. 5 may be placed either physically at the first location 116a or any offset vertically among the physical blocks 24', for example, at location 116b by a simple modification of the spatial object code 28 without the time-consuming iteration of recompilation.

In addition to controlling the location of the spatial object code 28 in the SPLC 12 after compilation, connections to that spatial object code 28 through the network 44 and between the spatial object code 28 and memory 50 may be made by setting the necessary variables for communication between physical blocks 24' required by intra-SPLC communication circuitry 74, setting the address translation table 92 of the memory address translation circuitry 82 and setting the network address translation table 88 of network translation circuitry 84. Setting these values also can be done post programming without recompilation.

Figure 7:
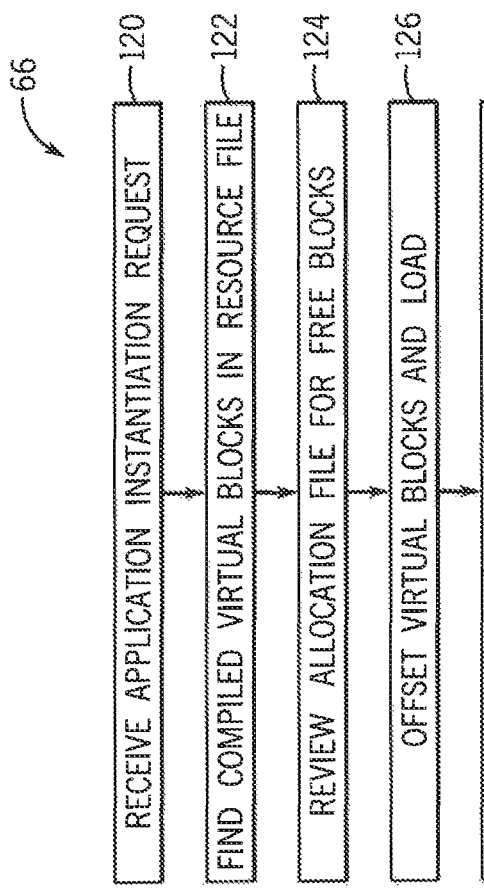
FIG. 7 is a flowchart of the hypervisor of FIG. 4 in instantiating the compiled program of FIG. 5 and relocating it per FIG. 6.

Referring now to FIG. 7, during operation of the cloud architecture 10', as indicated by process block 120, the cloud architecture 10' may receive an application program instantiation request from a user 14 or automatically in response to scaling demands monitored by the cloud architecture 10'.

At process block 122, the SPLC virtualizer program 66 finds the precompiled spatial object code 28 in the resource table 70 and determines the number of physical blocks 24' required (equal to the number virtual blocks 24).

At process block 124, the SPLC virtualizer program 66 reviews the allocation table 68 to find SPLCs 12 that have room for the necessary number of physical blocks 24'. Generally a priority will be given to a single SPLC 12 that can hold all of the physical blocks 24', but as will be discussed, multiple SPLCs 12 can be used for this purpose. In that regard, SPLCs 12 on the same card 40 are preferred for high-speed operation.

At process block 126, the data of the spatial object code 28 is reviewed and modified to provide the necessary offset to be received by the identified SPLC 12. This process can be done by direct inspection of the spatial object code 28 and does not require recompilation but simply changes position data in the compilation file.

Figure 6:
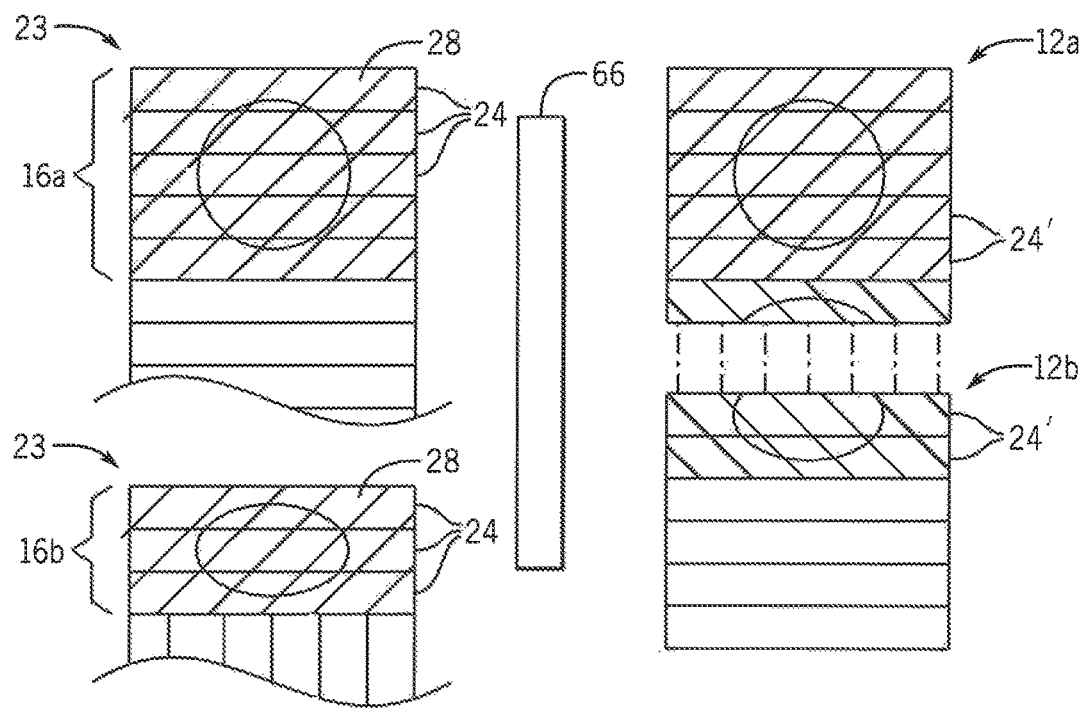
FIG. 6 is a figure similar to FIG. 5 showing relocation of two different compiled programs, one fitting within a single SPLC and one spanning two SPLCs.

Referring now also FIG. 6, in a first instantiation, a program 16a implemented as five physical blocks 24' in spatial object code 28 may be placed in a first SPLC 12a in the first five physical blocks 24' of that SPLC 12a. At a later instantiation of a program 16b, compiled spatial object code 28 may comprise only three physical blocks 24'. Depending on the availability of other SPLCs 12, the virtualizer program 66 may put a first virtual block 24 of program 16b in a physical block 24' of SPLC 12a and the remaining virtual blocks 24 into physical blocks 24'in a second SPLC 12b.

At process block 128, in both the allocation of the first program 16a and second program 16b, the memory address translation circuitry 82 and the network translation circuitry 84 associated with those program 16a and 16b will be loaded with the necessary variables to allow connection of appropriate memory values to the allocated physical blocks 24' programs 16a and 16b as located (essentially providing address translation).

In addition, at process block 130 for both the first program 16a and the second program 16b, the intra-SPLC communication circuitry 74 is also loaded with the variables necessary for communication between physical blocks 24'. These processes simply load values into registers and thus do not require a compilation of the program 16. While in the example of program 16a, the communication between blocks 124 could conceivably be performed in the compilation process, the compiler intentionally interposing the use of intra-SPLC communication circuitry 74 in the communication between physical blocks 24' to facilitate dividing a given program 16 among different SPLCs 12. This can be seen with respect to program 16b. For this program, the SPLC virtualizer program 66 proceeds to process block 132 to also load inter-SPLC communication circuitry 76 with the necessary variables for inter-SPLC communication. This inter-SPLC communication circuitry 76 is activated in lieu of intra-SPLC communication circuitry 74 but, as noted, provides local gating so that the program 16b is not adversely affected by arbitrary division between SPLCs 12. Note that the second and third physical blocks 24' of program 16b do have their inter-SPLC circuits activated and variables set per process block 130.

At process block 133, the allocation table 68 (shown in FIG. 4) is updated to indicate this use of SPLC resources.

Figure 9:
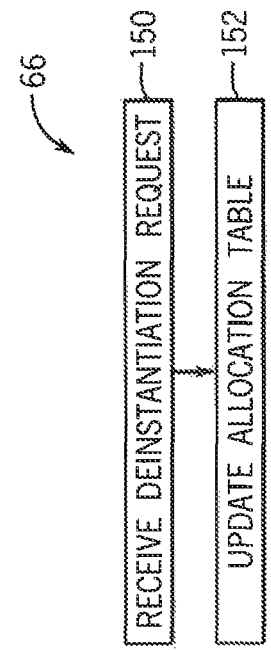
FIG. 9 is a figure showing operation of the hypervisor in freeing up allocated SPLC space.

Referring now to FIG. 9, upon receipt of a de-instantiation request per process block 150, the SPLC virtualizer program 66 may review the allocation table 68 to identify those physical blocks 24' where the de-instantiated program resides. Those physical blocks 24' may then be freed in the allocation table 68 for later use as indicated by process block 152 and/or a variable set in the memory address translation circuitry 82 and network translation circuitry 84 to deactivate this circuitry. These freed physical blocks 24' may be later used by overwriting the nonvolatile memory controlling interconnection of the circuitry of a standard SPLC.

Figure 10:
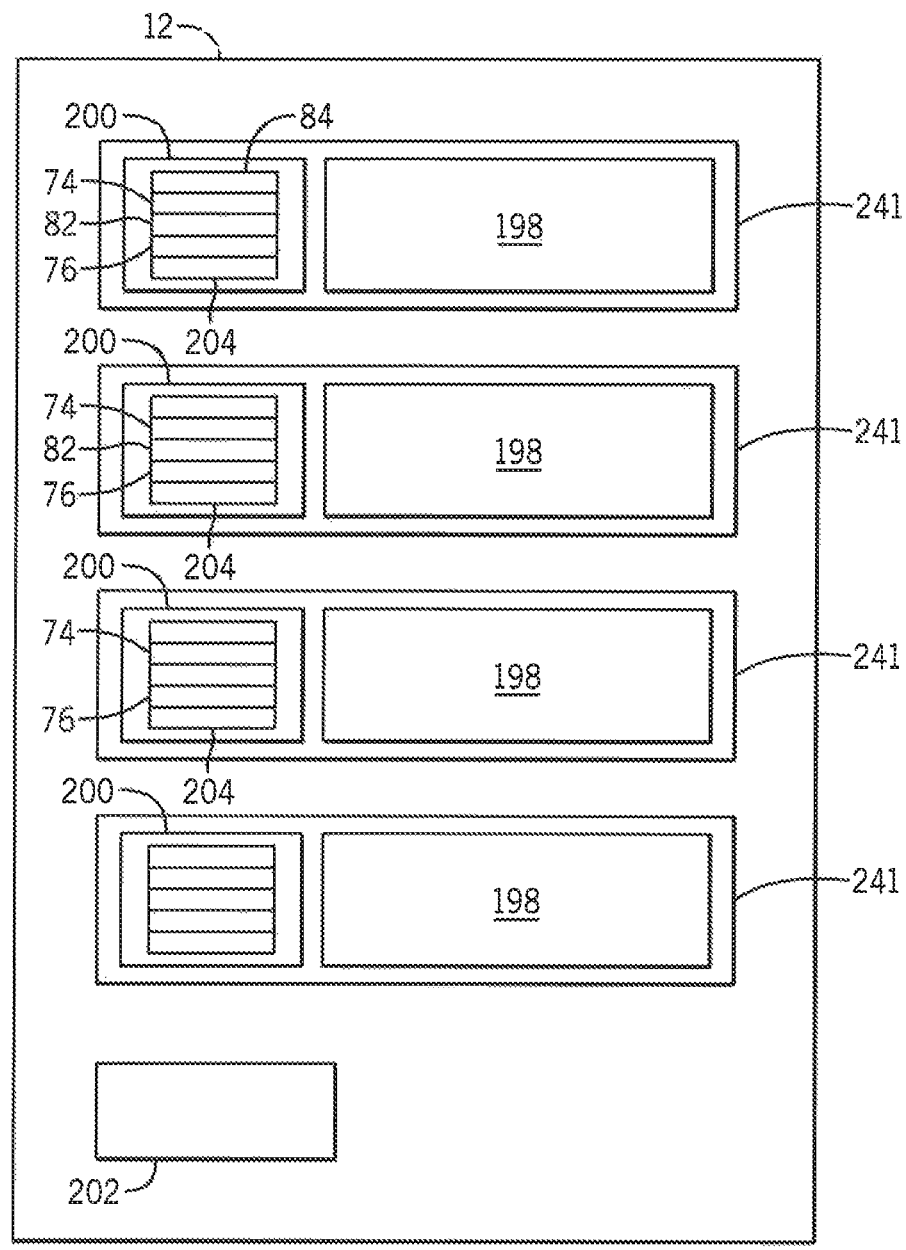
FIG. 10 is a block diagram similar to FIG. 4 showing the specially designed SPLC suitable for use with the present invention.

Referring now to FIG. 10, generally standard FPGA circuits are not designed to be divided into identical physical blocks 24' of a type that can well implement the present invention. Accordingly the invention contemplates a special purpose SPLC 12 providing a set of identical physical blocks 24' on a single integrated circuit each providing a programmable portion 198 providing generally the resources shown in FIG. 4 of configurable logic blocks 96, switch blocks 98, connection blocks 100, and hard IP blocks 102 that are identical in each of the physical blocks 24'.

In contrast to a typical FPGA, however, each of the physical blocks 24' also provides non-programmable resources 200 of the network translation circuitry 84 and the memory address translation circuitry 82, the latter providing independent access to memory 50 for each of the physical blocks 24' and address translation as needed. The non-programmable resources 200 may also provide for the intra-SPLC communication circuitry 74 and inter-SPLC communication circuitry 76 allowing communication between programmable sections 198 as well as for other interface circuits for peripherals associated with the physical blocks 24'. By laying out the circuitry of the SPLC 12 to provide unshared non-programmable resources 200, improved utilization of the circuitry of the SPLC 12 with respect to the present invention is provided by increasing the number of physical blocks 24' available for virtual blocks 24. It will be appreciated that although these non-programmable resources 200 cannot be reconfigured like the programmable resources 198 (that is dataflow among functional elements cannot be altered by spatial programming) register values may be set to allow the proper connections between the devices connected by the interfaces, for example by setting addresses or the like.

It will be appreciated that in this case the physical blocks 24' may have not only a one dimensional column periodicity, but can be formed in a two dimensional array while still providing identical resources, this latter configuration being extremely difficult with conventional FPGAs which do not exhibit this uniformity of resources in column and row.

The integrated circuit holding the physical blocks 24' may also provide for standard FPGA type circuitry including programming circuitry 202 that may receive spatially compiled application program portions and ma.y control the circuitry of the physical blocks 24' to program them by controlling switches that route the flow of data through the various resource elements in the manner of a standard FPGA.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features of the present disclosure and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

References to "a microprocessor" and "a processor" or "the microprocessor" and "the processor," can be understood to include one or more microprocessors that can communicate in a stand-alone and/or a distributed environment(s), and can thus be configured to communicate via wired or wireless communications with other processors, where such one or more processor can be configured to operate on one or more processor-controlled devices that can be similar or different devices. Furthermore, references to memory, unless otherwise specified, can include one or more processor-readable and accessible memory elements and/or components that can be internal to the processor-controlled device, external to the processor-controlled device, and can be accessed via a wired or wireless network.

It is specifically intended that the present invention not be limited to the embodiments and illustrations contained herein and the claims should be understood to include modified forms of those embodiments including portions of the embodiments and combinations of elements of different embodiments as come within the scope of the following claims. All of the publications described herein, including patents and non-patent publications, are hereby incorporated herein by reference in their entireties To aid the Patent Office and any readers of any patent issued on this application in interpreting the claims appended hereto, applicants wish to note that they do not intend any of the appended claims or claim elements to invoke 35 U.S.C. 28(f) unless the words "means for" or "step for" are explicitly used in the particular claim.

The invention claimed is:

1. A spatially-programed logic circuit (SPLC) array architecture comprising:
   a set of general-purpose computer processing units;
   a set of SPLCs each providing programmably interconnectable resources divisible into multiple identical physical blocks of multiple resources:
   a memory system including a resource file and an allocation file, the resource file holding spatially compiled different application programs compiled to an indicated number of identical virtual blocks of SPLC resources mappable to the identical physical blocks of the set of SPLCs and the allocation file holding a list of available identical physical blocks in the SPLCs; and
   an interconnection network communicating between the computer processing units and the SPLCs;
   wherein at least one computer processing unit executes a virtualizer communicating with the resource file and the allocation file to:
   (a) receive a request to instantiate an SPLC application program identifying a number of the identical virtual blocks;
   (b) identify the spatially compiled application program in the resource file;
   (c) identify at least one SPLC having identical physical blocks for holding the identified number of the identical virtual blocks of the identified spatially compiled application program using the allocation file;
   (d) relocate the spatially compiled application program to be received by the identified identical physical blocks; and (e) program the identified at least one SPLC to receive the relocated indicated number of the identical virtual blocks of the identified spatially compiled application program.

2. The SPLC array architecture of claim 1 wherein the at least one computer processing unit executes the virtualizer at step (d) to relocate the spatially complied application program of different of the identified virtual blocks to at least two SPLCs.

3. The SPLC array architecture of claim 1 wherein the resource file holding the spatially compiled application programs further holds a spatially compiled address translation program and further including step (f) loading the spatially compiled address translation program into the at least one identified the SPLC and providing offset addresses to the address translation program based on the at least one identified SPLC and the relocation of the spatially compiled application program.

4. The SPLC array architecture of claim 3 wherein the address translation program provides a virtualization in a communication between the at least one identified SPLC and computer memory.

5. The SPLC array architecture of claim 3 wherein the resource file holding the spatially compiled application program further holds a spatially compiled inter-SPLC program communication program for communicating between SPLCs.

6. The SPLC array architecture of claim 5 wherein the computer processor executing the virtualizer further divides an application program among at least two different SPLCs and provides inter-SPLC programs on the two different SPLCs with connection variables to connect the two SPLCs for data flow between portions of the application program.

7. The SPLC array architecture of claim 6 wherein the computer processor executing the virtualizer divides the application program between two different SPLCs only between spatial rows of identical physical blocks of the application program.

8. The SPLC array architecture of claim 3 wherein the resource file holding the spatially compiled application program further holds a spatially compiled intra-SPLC communication program for communicating between the identical physical blocks within a single SPLC.

9. The SPLC array architecture of claim 8 wherein the computer processor executing the virtualizer further loads the intra-SPLC communication program with connection variables to connect different identical physical blocks in an SPLC for data flow between the different identical physical blocks.

10. The SPLC array architecture of claim 8 wherein the resource file holding the spatially compiled application program further holds a spatially compiled inter-SPLC program communication program for communicating between SPLCs and wherein the inter-SPLC communication program and intra-SPLC communication program have local gating to synchronize the received data.

11. The SPLC array architecture of claim 1 wherein the computer processing unit performs the relocating of step (d) by applying an offset to portions of the spatially compiled application program data.

12. The SPLC array architecture of claim 1 including at least one computer processor executing an SPLC compiler wherein the compiler has a target architecture comprised of identical virtual blocks, wherein the number of identical virtual blocks is larger than the number identical physical blocks in each SPLC.

13. The SPLC array architecture of claim 12 wherein the compiler minimizes at least one of: the number of the identical physical blocks, the number of communication paths between the identical physical blocks, and the path length between the identical physical blocks in the spatially compiled program.

14. The SPLC array architecture of claim 1 wherein the resource file holding the spatially compiled application programs further holds a spatially compiled network communication program for communicating with the interconnection network and further including step (f) loading the spatially compiled network communication program into the at least one identified SPLC and providing a network address to the network communication program based on the at least one identified SPLC and the relocation of the spatially compiled application program.

15. The SPLC array architecture of claim 1 wherein the set of SPLCs are grouped in clusters on a circuit board sharing a memory and network communication hardware.

16. The SPLC array architecture of claim 1 wherein the computer processing unit executing the virtualizer to perform step (d) selects among different SPLCs to minimize division of the application program between SPLCs.

17. The SPLC array architecture of claim 1 wherein the SPLC's are further divisible into multiple identical second physical blocks of multiple resources different from the identical physical block of multiple resources; and wherein the resource file holds spatially compiled different application programs compiled to an indicated number of identical second virtual blocks of SPLC resources mappable to the identical second physical blocks of the set of SPLCs and the allocation file holding a list of available identical second physical blocks in the SPLCs; and wherein the at least one computer processing unit executes the virtualizer communicating with the resource file to:

(f) receive a request to instantiate an SPLC second application program identifying a number of the identical second virtual blocks:

(g) identity the spatially compiled second application program in the resource file;

(h) identify at least one SPLC having identical second physical blocks for holding the identified number of the identical second virtual blocks of the identified spatially compiled application program:

(i) relocate the spatially compiled second application program to be received by the identified second physical blocks; and (j) program the identified at least one SPLC to receive the relocated indicated number of the identical second virtual blocks of the identified spatially compiled second application program.

18. The SPLC array architecture of claim 1 wherein the set of SPLC are selected from the group consisting of: field programmable gate arrays (FPGAs), complex programmable logic devices (CPLD), coarse-grained reconfigurable arrays (CGRA).

19. The SPLC array architecture of claim 1 wherein the SPLCs each comprise:

an integrated circuit providing a set of identical physical blocks each holding:

(a) field programmable processing resources that can be programmably connected to change data flow through the processing resources to implement at least a portion of an application program;

(b) non-programmable interface circuitry providing communication between the physical blocks and other physical blocks and communication between the physical blocks and external circuitry; and the integrated circuit further providing programming circuitry for receiving a compiled application program and selectively programming the programmable resources of the physical blocks according to that application program.

\* \* \* \* \*